United States Patent [19]

Westermeier

[11] Patent Number: 4,589,116
[45] Date of Patent: May 13, 1986

[54] LASER DIODE WITH UNIFORM MECHANICAL STRESS AND/OR HEAT DISSIPATION

[75] Inventor: Heinz Westermeier, Neubiberg, Fed. Rep. of Germany

[73] Assignee: Siemens Aktiengesellschaft, Berlin & Munich, Fed. Rep. of Germany

[21] Appl. No.: 633,598

[22] Filed: Jul. 23, 1984

[30] Foreign Application Priority Data

Aug. 11, 1983 [DE] Fed. Rep. of Germany ....... 3329107

[51] Int. Cl.⁴ .............................................. H01S 3/04
[52] U.S. Cl. ....................................... 372/36; 357/81; 372/46
[58] Field of Search ............... 372/36, 44, 46; 357/17, 357/81, 71

[56] References Cited

U.S. PATENT DOCUMENTS 4,161,701   7/1979   Takeda et al. .................... 372/36

FOREIGN PATENT DOCUMENTS 0064288   5/1977   Japan ........................... 372/36
2105100   3/1983   United Kingdom ............... 372/46

Primary Examiner—James W. Davie
Attorney, Agent, or Firm—Hill, Van Santen, Steadman & Simpson

[57] ABSTRACT

For reduction and uniformity of mechanical stresses and for uniformity of current supply and heat dissipation into or out of a laser active zone of a laser diode, an additional layer preferably restricted to a waveguide region is provided between a contact layer and a solder layer mounting the diode on a heat sink.

12 Claims, 1 Drawing Figure

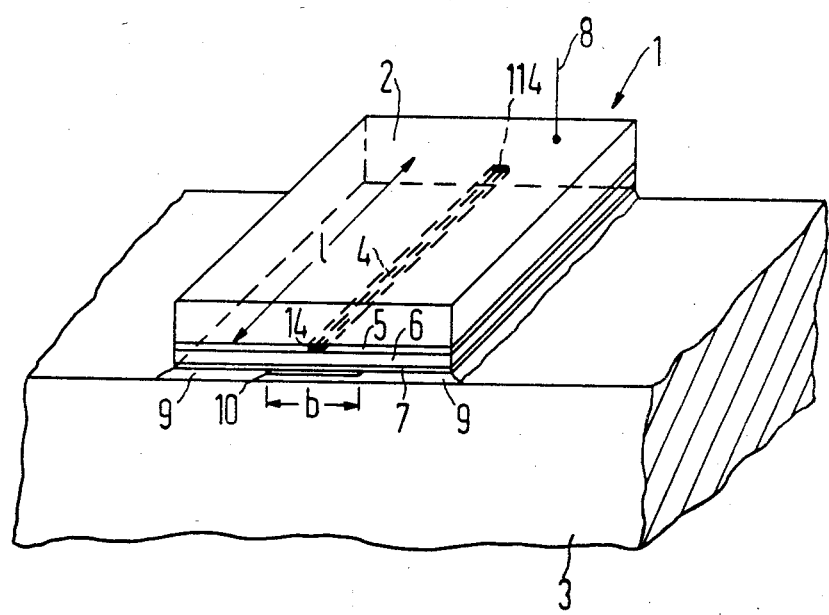

LASER DIODE WITH UNIFORM MECHANICAL STRESS AND/OR HEAT DISSIPATION

BACKGROUND OF THE INVENTION

The present invention relates to a laser diode formed with a semiconductor substrate in which a strip-shaped laser active zone is provided.

From "Electronics Letters", Volume 18 (1982), pages 631 and following, incorporated herein by reference, a laser diode is known which as is the case with the diode of this invention, is provided for coupling to a glass fiber serving for radiation transmission. The laser diode described in greater detail in this publication in Figure 2 is soldered on a heat sink which is a silicon substrate. A V-shaped groove is introduced into the material of the heat sink which serves for accommodating the solder. This groove, for which a width of 75 μm is disclosed, and the substrate of the actual diode disposed thereabove, are so aligned relative to one another that the surface of this groove and the laser-active zone lie precisely above one another. The surface of a portion of the heat sink has additional grooves running partially transversely thereto, which are likewise provided for a flowing of the solder. For the accommodation of a supply of the particular solder which is later to fill the grooves, a corresponding recess is provided in the heat sink.

In this publication, it is also stated that thermal expansions are very disadvantageous for the life of a laser. In this publication, the solution to this problem is visualized as being restricted to the use of silicon for the heat sink and the use of the above described grooves.

SUMMARY OF THE INVENTION

It is an object of the present invention to disclose techniques for a laser diode with which technical improvements can be achieved and, in particular, reducing occurring mechanical stresses, obtaining uniform mechanical stresses, and improving and providing a uniform heat dissipation and current supply.

This object is achieved by assembling the substrate with the strip-shaped laser active zone near one of its surfaces, this surface in manufacturing previously being "upside". This substrate is mounted in upside down-technology. A metal contact layer is positioned between the heat sink and the substrate in the proximity of the laser-active zone. A solder layer is provided between the metal contact layer and the heat sink and which interconnects the substrate to the heat sink. Between a portion of the contact layer and a portion of the solder layer an additional layer comprised of a material which substantially prevents alloy formation is provided between the metal of the contact layer and solder. The additional layer extends over an entire length of the laser-active zone and has a width which corresponds at least to the width of a waveguide region of the laser-active zone.

The invention is based on the knowledge that an assembly, as is known, of a laser diode on its heat sink e.g. such as the assembly described in the above-captioned publication, does not yet solve the problems in an optimum fashion, i.e. that there is yet a better solution since it is ensured according to the invention, counter to known embodiments, that the immediate adjacent region to the laser active zone is at least largely excluded from a mechanically stable connection and/or an alloy connection with the heat sink. This excluded region extends over the entire length of the strip-shaped laser-active zone. Its width is dimensioned so that it extends over the waveguide region of the wave generated in the laser-active zone—of the laser radiation—and is also adjusted as precisely as possible relative to the latter.

The contact layer adjacent this strip-shaped, laser-active zone extends at least over the waveguide region. This contact layer is a metal layer preferably of gold applied on the adjacent surface of the substrate. If, as is known, the gold and the solder have a direct contact with one another, then an alloy of the gold occurs during the soldering.

With the inventive arrangement and dimensioning of the additional layer, the original state of the contact layer is preserved.

The additional layer which is provided and dimensioned according to the invention comprises a material, preferably a metal oxide such as aluminum oxide, silicon oxide, or the like, or silicon nitride. These materials prevent alloy formation between the metal of the contact layer and indium, lead, or tin conventionally employed as solder. In the region of this additional layer, in the laser diode of the invention, only a superimposition of individual layers or surfaces is present. Accordingly, the latter nevertheless are compactly superimposed. In utilizing such a metal oxide or silicon nitride it is advantageous to make the width of the additional layer equal to the width of the waveguide region.

The above-described inventive techniques make it possible that in the material of the substrate in the region of the laser active zone proceeding from the heat sink, a maximum uniform mechanical stress can occur. Also, they provide uniformity of heat transfer from the laser-active zone of the substrate into the heat sink. The heat transfer, in the case of a laser diode of the invention is not even necessarily less in the region of this additional layer than in the case of an alloy junction. The heat transfer, however, is more homogeneous and the overall heat dissipation in the case of the diode of the invention is, moreover, better than in the case of laser diodes which are mounted upside-up.

Also, the improvement with respect to the current supply to the laser-active zone is based on the inventively provided additional layer. The prevention of an alloy of the gold metal of the contact layer, for example, in the region of the additional layer, guarantees the retention of the conductivity of this contact layer which is both high as well as uniform over the entire area. Therefore, current flows through the laser-active zone in a more homogeneous fashion. The same applies to the heat dissipation in this contact layer.

BRIEF DESCRIPTION OF THE DRAWING

The drawing FIGURE illustrates a perspective view of the laser diode assembly with heat sink according to the invention.

DESCRIPTION OF THE PREFERRED EMBODIMENTS

In the drawing FIGURE, an inventive laser diode 1 together with its heat sink is shown. The semiconductor substrate 2 preferably of gallium arsenide or indium phosphide is also shown along with heat sink 3 preferably of copper. The heat sink 3 is, as is apparent, only illustrated in fragmentary fashion. It is pointed out that the dimensional relationships of the substrate and the heat sink mutually and relative to one another do not correspond to the actual relationships, but are selected for illustration clarity.

The strip-shaped, laser-active zone 4 in the substrate 2 preferably contains a pn-junction (not illustrated). Layers 5, 6 are preferably manufactured by epitaxy. It is apparent that these layers 5, 6 and the laser-active zone 4 in the substrate 2 are arranged so that layers 5, 6 and the zone 4 are very close to the (after upside-down mounting) bottom surface of the substrate 2 in FIG. 1.

A preferably entire-area metal layer 7 of gold is disposed on the lower (and hence on the substrate 2 exterior) surface of the layer 6 in FIG. 1. The layer 7 is one current supply electrode. As a second current supply electrode a substrate contact 8 can be sufficient. Not illustrated in FIG. 1 are the various techniques known per se of designing the current flow from the contact layer 7 to the connection 8 such that, if possible, the entire current (in a vertical direction in the FIGURE) is forced through the strip-shaped laser-active zone 4, whereby within said zone 4, as is known, as uniform as possible a current distribution prevails.

A solder material 9 has a layer form in the case of the completed laser diode 1, and connects the substrate 2 in a mechanically rigid fashion with the heat sink 3.

The end face 14 of the laser-active zone 4 is also shown. This end face 14 (front in the drawing FIGURE) is a fraction of the end face of the substrate 2 which, as is known, has a specular property. This surface 14 is the one exit surface for the radiation generated in the laser-active zone 4. Correspondingly, a surface 114, disposed opposite the surface 14, is present having, as a rule, the same properties.

In accordance with the invention, in the case of the laser diode 1 of FIG. 1, a layer 10 is provided. This layer is disposed between the contact layer 7 and a portion of the solder layer 9, or between the substrate 2 and the heat sink 3, respectively. In one dimension, the layer 10 extends over the entire length 1 of the substrate 2, or of the laser-active zone 4, respectively. The width b of layer 10, dimensioned in an orthogonal direction thereto, is inventively dimensioned so that, in any case, it is wider than the illustrated width of the zone 4. In other words, it is wider than the zone in the substrate 2 to which the electric current flow is restricted in the region of the laser radiation generation. This width of the laser active zone, moreover, amounts, as is known, to approximately 7 μm. The distance of the zone 4, i.e. the distance of the layer 5 (in FIG. 1, lower) from the surface of the substrate 2 provided with the contact layer 7, as is known, amounts to approximately 3 μm.

In accordance with the invention, the width dimension b of the additional layer 10 is greater than the width of the zone 4 by a multiple. The dimension b is selected at least as wide as the waveguide region for the laser radiation in the substrate 2. The laser radiation is essentially generated within the strip-shaped zone 4. However, the electro-optic effective region of the vibration mode of the radiation developing in the zone 4 extends considerably beyond zone 4. Mechanical interferences such as stresses and inhomogeneities are disadvantageous for a laser diode even when they occur in the latter in the region adjacent to zone 4.

It is advantageous to adapt, if possible, the width b of the additional layer 10 to the width of the waveguide region in the substrate 2.

In accordance with the invention, the additional layer 10 consists of a material which prevents an alloy of the metal of the contact layer 7, preferably consisting of gold, with the solder metal of the layer 9. In particular, metal oxides such as aluminum oxide and silicon dioxide, and also silicon nitride are suitable for this purpose. They reliably prevent the above-described alloy effect. The corresponding can also be achieved by metals such as molybdenum and tungsten for the additional layer 10. Both molybdenum and tungsten, as well as oxide or nitrides, have a sufficiently good thermal conduction for the conduction of high heat quantities generated in the laser active zone 4 into the heat sink 3. The fact that the metal oxides, or nitrides, respectively, have a relatively poor electric conductivity is no problem for the invention since the current supply via the contact layer 7 can be guaranteed to a sufficient extent. In the invention, no reduction of the conductivity through alloy formation in, for example, the gold of the contact layer 7 occurs. An alloy formation in a proximity of zone 4 would result in the metal of this layer 7 in proximity to the zone 4 undergoing an impairment of the specific electric conductivity. This can occur to a very great extent, for example, for gold in the case of alloying with indium, tin, and the like. The diffusion resistance in the contact layer 7 is to the greatest extent uniform and undisturbed by the protection of the additional layer 10 in the region adjacent to the laser-active zone 4 according to the invention. An alloy of the metal of the contact layer 7 occurring outside the region of the additional layer 10, by contrast, is not a problem because inhomogeneities relative to the zone 4 occurring therein lie too far outside for them to be able to bring about interferences which are to be avoided with the invention. Other metals to be considered for the contact layer are platinum and silver.

Between the additional layer 10 and the corresponding portion of the solder layer 9 or the heat sink 3, in the case of the invention no mechanical connection corresponding to an alloy, or corresponding to a solder connection, exists. A mechanical connection is present therein such as is physically provided as is known between aluminum oxide, silicon dioxide, and the like, and semiconductor material or metal.

For the invention, the width b of the additional layer is dimensioned between 10 and 100 μm, and preferably between 30 and 70 μm.

The material of the substrate 2 in the region of the zone 4 is largely free of non-uniform mechanical stresses as far as the additional layer extends. Such stresses would occur in the case of direct soldering of the substrate 2 or the contact layer 7 on the heat sink 3. Inhomogeneities of mechanical stresses arising outside the width b in the substrate 2 are not a great problem since their effects influence only to a minor extent the waveguide region and don't effect the region of the zone 4.

In order to guarantee these above effects of the additional layer 10 provided according to the invention a thickness of the layer 10 of 0.1 to 1 μm and preferably 0.2 μm suffices.

Although various minor changes and modifications might be proposed by those skilled in the art, it will be understood that I wish to include within the claims of the patent warranted hereon all such changes and modifications as reasonably come within my contribution to the art.

I claim as my invention:
1. A laser diode, comprising:
   a semiconductor substrate in which a strip-shaped laser active zone is provided near its upside;

the substrate being assembled in upside-down-technology on a heat sink with the laser active zone at a bottom side of the substrate and a metal contact layer being positioned between the heat sink and the substrate in a proximity of the laser-active zone;

a solder layer between said metal contact layer and said heat sink with which the substrate and the heat sink are interconnected in fixed manner;

between a portion of the contact layer and a portion of the solder layer an additional layer comprised of a material which substantially prevents alloy formation between the metal of the contact layer and the solder; and said additional layer extending over an entire length of the laser-active zone and having a width which corresponds at least to a width of a waveguide region of the laser-active zone.

2. A laser diode according to claim 1 wherein the metal of the contact layer is gold.

3. A laser diode according to claim 1 wherein the material of the additional layer is a metal oxide with a relatively low electric conductivity compared to the contact layer, but good thermal conductivity.

4. A laser diode according to claim 3 wherein the material of the additional layer is aluminum oxide.

5. A laser diode according to claim 3 wherein the material of the additional layer is silicon oxide.

6. A laser diode according to claim 1 wherein the material of the additional layer is silicon nitride.

7. A laser diode according to claim 1 wherein the width of the additional layer is 10 to 70 $\mu$m.

8. A laser diode according to claim 1 wherein the width of the additional layer is substantially equal to the width of the waveguide region.

9. A laser diode according to claim 1 wherein the additional layer conprises molybdenum.

10. A laser diode according to claim 1 wherein the additional layer comprises tungsten.

11. A laser diode, comprising:

a semiconductor substrate with upper and lower surfaces;

the upper surface having a substrate contact and the lower surface joining with at least first and second layers;

a strip-shaped laser active zone adjacent the lower surface of the substrate;

a metal contact layer in contact with the most outside of said layers;

a heat sink;

a solder layer connecting the contact layer to the heat sink; and an additional layer comprised of a material which substantially prevents alloy formation between metal of the contact layer and the solder; and said additional layer extending over substantially an entire length of the laser-active zone and having a width which corresponds at least to a width of a waveguide region of the laser-active zone.

12. A laser diode according to claim 11 wherein the width of the additional layer is 10 to 70 $\mu$m.

* * * * *